United States Patent
Teshirogi et al.

(10) Patent No.: US 6,839,032 B2
(45) Date of Patent: Jan. 4, 2005

(54) PROTABLE RADIO TERMINAL TESTING APPARATUS USING SINGLE SELF-COMPLEMENTARY ANTENNA

(75) Inventors: Tasuku Teshirogi, Tokyo (JP); Nobutoshi Otonari, Sagamihara (JP)

(73) Assignee: Anritsu Corporation, Tokyo (JP)

( * ) Notice: Subject to any disclaimer, the term of this patent is extended or adjusted under 35 U.S.C. 154(b) by 37 days.

(21) Appl. No.: 10/398,333

(22) PCT Filed: Jun. 13, 2002

(86) PCT No.: PCT/JP02/05887
§ 371 (c)(1),
(2), (4) Date: Apr. 3, 2003

(87) PCT Pub. No.: WO03/021824
PCT Pub. Date: Mar. 13, 2003

(65) Prior Publication Data
US 2004/0012529 A1 Jan. 22, 2004

(30) Foreign Application Priority Data
Aug. 30, 2001 (JP) ........................ 2001-262259

(51) Int. Cl.⁷ ............................... H01Q 1/24
(52) U.S. Cl. .................. 343/702; 343/703; 343/906
(58) Field of Search ................ 343/702, 703, 343/906, 795, 895, 700 MS; 455/89, 90; H01Q 1/24, 1/36

(56) References Cited

U.S. PATENT DOCUMENTS 5,668,561 A * 9/1997 Perrotta et al. ............. 343/702
6,229,490 B1 * 5/2001 Hofmann ..................... 343/702
6,525,620 B1 * 2/2003 Barabash ................... 333/24 C

FOREIGN PATENT DOCUMENTS

| JP | 6-326489 A | 11/1994 |
| JP | 7-250016 A | 9/1995 |
| JP | 9-135117 A | 5/1997 |
| JP | 10-90335 A | 4/1998 |
| JP | 10-260215 A | 9/1998 |
| JP | 10-276033 A | 10/1998 |

* cited by examiner

Primary Examiner—Hoanganh Le
(74) Attorney, Agent, or Firm—Frishauf, Holtz, Goodman & Chick, P.C.

(57) ABSTRACT

A portable radio terminal testing apparatus has an antenna coupler 20, a connecting member 16, and a measuring device 15. The antenna coupler 20 has a placement member 35, a coupling antenna 25, a pair of through-connection portions, and an impedance transformer 31. The placement member 35 accepts a portable radio terminal 1, which is a testing object, in an unrestricted state. The coupling antenna 25 is disposed so as to be electromagnetically coupled with an antenna 19 of the portable radio terminal 1, and has a pair of antenna elements which are formed at one face side of a dielectric substrate 26 and which have a planar antenna structure of a predetermined shape, and a pair of feeding points, and is formed from a self-complementary antenna having a predetermined impedance within an operating frequency range including at least 800 MHz to 2.5 GHz order.

15 Claims, 9 Drawing Sheets

US 6,839,032 B2

PROTABLE RADIO TERMINAL TESTING APPARATUS USING SINGLE SELF-COMPLEMENTARY ANTENNA

This application is a U.S. National Phase Application under 35 USC 371 of International Application PCT/JP02/05887 (not published in English) filed Jun. 13, 2002.

TECHNICAL FIELD

The present invention relates to a portable radio terminal testing apparatus using a single self-complementary antenna and, more particularly to a portable radio terminal testing apparatus utilizing a technique applicable of a wide frequency bandwidth with a simple structure by using a self-complementary antenna as a coupling antenna when portable radio terminals, such as mobile cellular phones, or the like, are tested.

BACKGROUND ART

In recent years, due to the popularization of portable radio terminals, such as mobile cellular phones, portable information terminal machines, or the like, requests for trouble diagnosis and the like have greatly increased.

Accordingly, the conventional method, in which a faulty portable radio terminal is sent to the manufacturer to be diagnosed, is no longer satisfactory.

Therefore, in order to reduce the inconvenience to the user, a method involving fault diagnosis in shops, etc., is being used.

In this way, in order for testing of portable radio terminals to be carried out at the shops, etc. which are not electromagnetically shielded, an antenna coupler 10 as shown in FIG. 15 is used.

The antenna coupler 10 has a shield box 11 which is freely able to open and close for accommodating a portable radio terminal 1, which is a testing object, a coupling antenna 12, which is fixed in the shield box 11 and is spatially coupled to an antenna 1a of the portable radio terminal 1, and a terminal 13 which is attached to an external face portion of the shield box 11 and which is connected to the coupling antenna 12 in the shield box 11 to connect a coaxial cable 16 to the coupling antenna 12 in the shield box 11 from the exterior.

When testing of the portable radio terminal 1 is carried out by using such an antenna coupler 10, the shield box 11 is opened. The shield box 11 is closed after the portable radio terminal 1, which is the testing object, is set at a predetermined position in the shield box 11. The terminal 13 and a measuring device 15 are connected by the coaxial cable 16. Testing such as calling, incoming, and sensitivity, and the like of the portable radio terminal 1 is carried out by the measuring device 15.

As the coupling antenna 12 of the antenna coupler 10 to be used for such a purpose, there is the need to cover the frequency bandwidth allocated to the portable radio terminal 1 which is the testing object.

However, the frequency bandwidth of the portable radio terminal 1 is different for each system. For example, an 800 MHz or 1.5 GHz bandwidth order is used in a conventional method. On the other hand, a 2.2 GHz bandwidth order is used in the third-generation W-CDMA system whose operation has recently started.

Moreover, because tightness can be supposed even in each frequency bandwidth, allocation of the 5 GHz bandwidth order has been newly considered, and hereafter, measuring and testing for portable radio terminals over a wide frequency bandwidth will be required.

Therefore, in order for one antenna coupler 10 to be able to correspond to these portable radio terminals 1 whose systems are different, a wide frequency bandwidth characteristic of the coupling antenna 12 is required.

As a method for solving this problem, in the antenna coupler disclosed in U.S. Pat. No. 6,229,490, two antenna elements having different frequency ranges each other and coupled by a diplexer, are used.

Further, in this antenna coupler, by firmly securing the portable radio terminal which is the measuring object at a predetermined position with respect to these two antenna elements by a securing means, coupling attenuation between the portable radio terminal and the antenna elements is made to be constant, and measuring of receiving sensitivity and the like is carried out.

However, in a method in which two antenna elements having different frequency ranges each other and coupled by the diplexer as described above, in order to cover, for example, the 2.2 GHz bandwidth order allocated to third-generation portable radio terminals in addition to the 800 MHz bandwidth order and the 1.5 GHz bandwidth order allocated the current portable radio terminals as described above, antenna elements having further different frequency ranges each other are added, and these antenna elements must be coupled by the diplexer.

Therefore, in such an antenna coupler, since design of the coupled portion is not easy, and high manufacturing accuracy is required, there is the problem that the entire antenna coupler cannot be realized inexpensively.

Further, in the antenna coupler, the operation for firmly securing the portable radio terminal by the securing means is necessary. The operations are complicated, and the posture of the portable radio terminal is regulated by the securing means. Therefore, there is the problem that it cannot cope with all the various types of portable radio terminals whose shapes or antenna positions vary.

DISCLOSURE OF INVENTION

An object of the present invention is to provide a portable radio terminal testing apparatus which solves the above-described problems, and which, with a simple structure, applicable of a wide frequency bandwidth, including the current frequency bandwidth and the frequency bandwidth expected for the future, and whose operation is easy, and which can correspond to various types of portable radio terminals whose shapes and antenna positions vary, and which uses a single self-complementary antenna as a coupling antenna.

In order to achieve the above object, according to a first aspect of the present invention, there is provided a portable radio terminal testing apparatus comprising an antenna coupler (20), connecting means (32), and a measuring device (15), wherein the antenna coupler comprises:
a placement member (35) which places a portable radio terminal (1), thereon which is a testing object, in an unrestricted state such that the portable radio terminal can be set in an arbitrary posture;
a coupling antenna (25) which is disposed so as to be electromagnetically coupled to an antenna (1a) of the portable radio terminal, which is the testing object, placed in an arbitrary posture on the placement member, the coupling antenna comprises:
first and second conductor patterns (25a, 25b) and first and second void patterns (25c, 25d) formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another; and
first and second antenna elements (27, 28) having planar antenna structures in which first and second feeding points (27a, 28b) are formed so as to face respective base end portions of the first and second conductor patterns,
so that the coupling antenna is formed as a self-complementary antenna having a predetermined impedance which is substantially constant from a lowest usable frequency to a highest usable frequency determined in accordance with sizes of the first and second antenna elements;
first and second through-connection portions (30a, 30b) which connect through the first and second feeding point portions of the coupling antenna formed at one face side of the dielectric substrate to opposing portions of another face side portion of the dielectric substrate; and
an impedance transformer (31) mounted at the other face side of the dielectric substrate in a state in which one end side thereof is connected to the first and second through-connection portions, wherein
the connecting means has a predetermined impedance and is configured to be able to connect the other end side of the impedance transformer of the antenna coupler and the measuring device,
the impedance transformer is configured to be able to carry out impedance conversion for matching the predetermined impedance of the coupling antenna and the predetermined impedance of the connecting means under predetermined conditions, and
the measuring device is configured such that predetermined tests including calling, incoming, and sensitivity for the portable radio terminal which is the testing object can be carried out via an antenna of the portable radio terminal which is the testing object electromagnetically coupled to the coupling antenna, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

In order to achieve the above object, according to a second aspect of the present invention, there is provided a portable radio terminal testing apparatus according to the first aspect, wherein the operating frequency range of the coupling antenna includes 800 MHz to 2.5 GHz order.

In order to achieve the above object, according to a third aspect of the present invention, there is provided a portable radio terminal testing apparatus according to the first aspect, wherein the coupling antenna is a linearly polarized type.

In order to achieve the above object, according to a fourth aspect of the present invention, there is provided a portable radio terminal testing apparatus according to the first aspect, wherein the coupling antenna is a circularly polarized type.

In order to achieve the above object, according to a fifth aspect of the present invention, there is provided a portable radio terminal testing apparatus according to the first aspect, wherein the portions of the first and second conductor patterns of the first and second antenna elements and the portions of the first and second void patterns are formed in spiral-shaped patterns.

In order to achieve the above object, according to a sixth aspect of the present invention, there is provided a portable radio terminal testing apparatus comprising a shield box (21), an antenna coupler (20) accommodated in the shield box, a measuring device (15) provided at an exterior of the shield box, and connecting means (32) for connecting the antenna coupler and the measuring device, wherein
the antenna coupler comprises:
a placement member (35) which places, within the shield box, a portable radio terminal (1) thereon, which is a testing object, in an unrestricted state such that the portable radio terminal can be set in an arbitrary posture;
a coupling antenna (25) which is disposed, within the shield box, so as to be electromagnetically coupled with an antenna (1a) of the portable radio terminal, which is the testing object, placed in an arbitrary posture on the placement member,
the coupling antenna comprise:
first and second conductor patterns (25a, 25b) and first and second void patterns (25c, 25d) formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another;
first and second antenna elements (27, 28) having planar antenna structures in which first and second feeding points (27a, 28b) are formed so as to face respective base end portions of the first and second conductor patterns,
so that the coupling antenna formed as a self-complementary antenna having a predetermined impedance which is substantially constant from a lowest usable frequency to a highest usable frequency determined in accordance with sizes of the first and second antenna elements;
first and second through-connection portions (30a, 30b) which connect through the first and second feeding point portions of the coupling antenna formed at one face side of the dielectric substrate to opposing portions of another face side portion of the dielectric substrate; and
an impedance transformer (31) mounted at the other face side of the dielectric substrate in a state in which one end side thereof is connected to the first and second through-connection portions, wherein
the connecting means has a predetermined impedance, and is configured to be able to pass through the shield box and connect another end side of the impedance transformer of the antenna coupler and the measuring device,
the shield box forms therein a space electromagnetically shielded from an exterior, and is configured to have an opening and closing portion for the portable radio terminal which is the testing object to be placed in and removed from the interior,
the placement member is configured such that the portable radio terminal can be placed on a surface which is separated by a predetermined distance from the coupling antenna in the interior of the space of the shield box, the impedance transformer is configured to be able to carry out impedance conversion for matching the predetermined impedance of the coupling antenna and the predetermined impedance of the connecting means under predetermined conditions within the shield box, and the measuring device is configured such that predetermined tests including calling, incoming, and sensitivity for the portable radio terminal which is the testing object can be carried out outside the shield box via an antenna of the portable radio terminal which is the testing object electromagnetically coupled to the coupling antenna within the shield box, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

In order to achieve the above object, according to a seventh aspect of the present invention, there is provided a portable radio terminal testing apparatus according to the sixth aspect, wherein the operating frequency range of the coupling antenna includes 800 MHz to 2.5 GHz order.

In order to achieve the above object, according to an eighth aspect of the present invention, there is provided a portable radio terminal testing apparatus according to the sixth aspect, wherein the coupling antenna is a linearly polarized type.

In order to achieve the above object, according to a ninth aspect of the present invention, there is provided a portable radio terminal testing apparatus according to the sixth aspect, wherein the coupling antenna is a circularly polarized type.

In order to achieve the above object, according to a tenth aspect of the present invention, there is provided a portable radio terminal testing apparatus according to the sixth aspect, wherein the portions of the first and second conductor patterns of the first and second antenna elements and the portions of the first and second void patterns are formed in spiral-shaped patterns.

In order to achieve the above object, according to an eleventh aspect of the present invention, there is provided a portable radio terminal testing apparatus comprising a shield room (21A), and an antenna coupler (20), connecting means (32), and a measuring device (15) which are respectively accommodated in the shield room, wherein the antenna coupler comprises:
a placement member (35) which places, within the shield room, of a portable radio terminal (1) thereon, which is a testing object, in an unrestricted state such that the portable radio terminal can be set in an arbitrary posture;
a coupling antenna (25) which is disposed, within the shield room, so as to be electromagnetically coupled with an antenna (1a) of the portable radio terminal, which is the testing object, placed in an arbitrary posture on the placement member,
the coupling antenna comprises:
first and second conductor patterns (25a, 25b) and first and second void patterns (25c, 25d) formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another;
first and second antenna elements (27, 28) having planar antenna structures in which first and second feeding points (27a, 28b) are formed so as to face respective base end portions of the first and second conductor patterns,
so that the coupling antenna is formed as a self-complementary antenna having a predetermined impedance which is substantially constant from a lowest usable frequency to a highest usable frequency determined in accordance with sizes of the first and second antenna elements;
first and second through-connection portions (30a, 30b) which connect through the first and second feeding point portions of the coupling antenna formed at one face side of the dielectric substrate to opposing portions of another face side portion of the dielectric substrate; and
an impedance transformer (31) mounted at the other face side of the dielectric substrate in a state in which one end side thereof is connected to the first and second through-connection portions, wherein
the connecting means has a predetermined impedance, and is configured to be able to connect another end side of the impedance transformer of the antenna coupler and the measuring device within the shield room,
the shield room forms therein a space electromagnetically shielded from an exterior, and is configured to have an opening and closing portion for the portable radio terminal which is the testing object to be placed in and removed from the interior,
the placement member is configured such that the portable radio terminal can be placed on a surface which is separated by a predetermined distance from the coupling antenna in the interior of the space of the shield room,
the impedance transformer is configured to be able to carry out impedance conversion for matching the predetermined impedance of the coupling antenna and the predetermined impedance of the connecting means under predetermined conditions within the shield room, and
the measuring device is configured such that predetermined tests including calling, incoming, and sensitivity for the portable radio terminal which is the testing object can be carried out in the shield room via an antenna of the portable radio terminal which is the testing object electromagnetically coupled to the coupling antenna within the shield room, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

In order to achieve the above object, according to a twelfth aspect of the present invention, there is provided a portable radio terminal testing apparatus according to the eleventh aspect, wherein the operating frequency range of the coupling antenna includes 800 MHz to 2.5 GHz order.

In order to achieve the above object, according to a thirteenth aspect of the present invention, there is provided a portable radio terminal testing apparatus according to the eleventh aspect, wherein the coupling antenna is a linearly polarized type.

In order to achieve the above object, according to a fourteenth aspect of the present invention, there is provided a portable radio terminal testing apparatus according to the eleventh aspect, wherein the coupling antenna is a circularly polarized type.

In order to achieve the above object, according to a fifteenth aspect of the present invention, there is provided a portable radio terminal testing apparatus according to the eleventh aspect, wherein the portions of the first and second conductor patterns of the first and second antenna elements and the portions of the first and second void patterns are formed in spiral-shaped patterns.

BEST MODE OF CARRYING OUT THE INVENTION

Hereinafter, several embodiments of the present invention will be described with reference to the drawings.

(First Embodiment)

Figure 1:
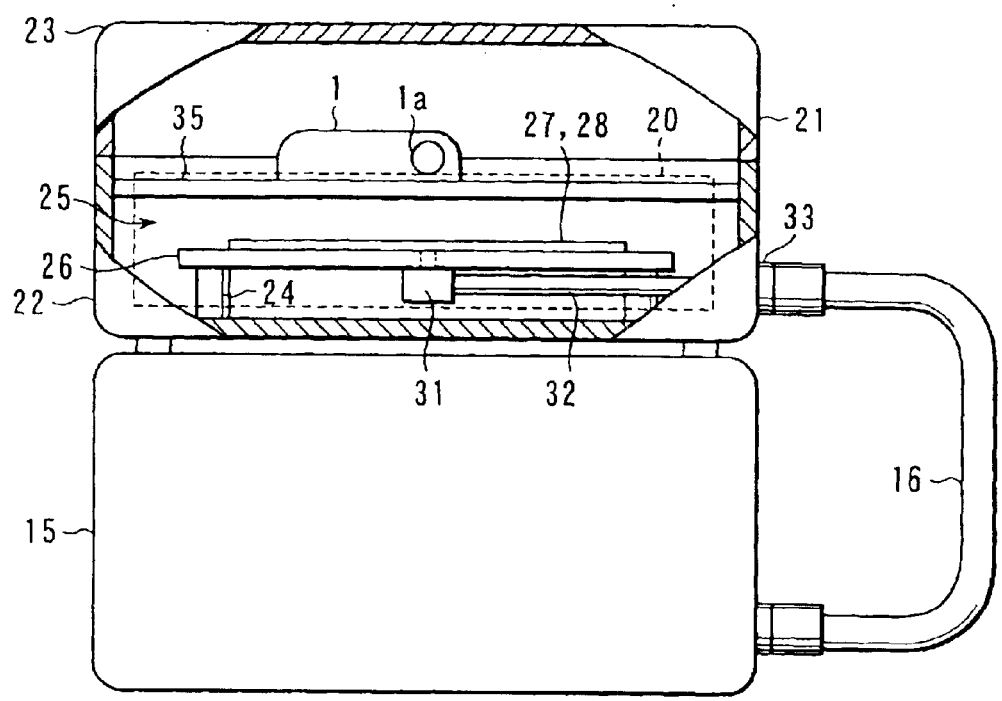
FIG. 1 is a sectional side elevation showing an entire configuration in which the shield box used as a portable radio terminal testing apparatus according to a first embodiment of the present invention is partially cutaway.

FIG. 1 is a sectional elevation showing an entire configuration in which a part of a shield box is cutaway when the shield box is used as a portable radio terminal testing apparatus according to a first embodiment of the present invention.

Figure 2:
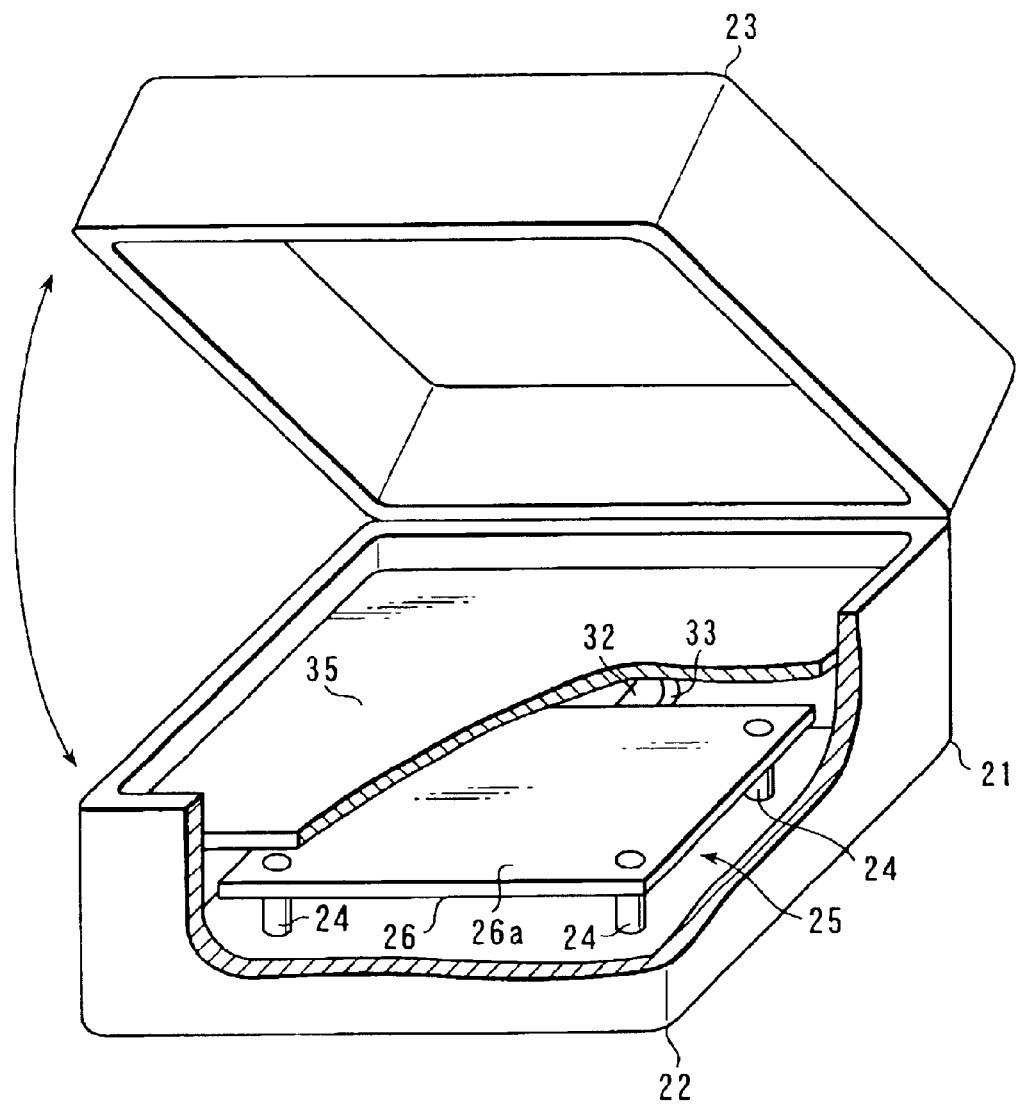
FIG. 2 is a perspective view showing a configuration of main portions in which a measuring device and connecting means are removed and the shield box is partially cutaway, when the shield box is used as the portable radio terminal testing apparatus according to the first embodiment of the present invention.

FIG. 2 is a perspective view showing a configuration of main portions in which a measuring device and connecting means are removed and a part of the shield box is cutaway when the shield box is used as the portable radio terminal testing apparatus according to the first embodiment of the present invention.

Further, in FIG. 2 illustrates, in particular, a portion of an antenna coupler 20 which is used in the portable radio terminal testing apparatus to which the present invention (hereinafter, simply called an antenna coupler) is applied and which is surrounded by the broken line frame in FIG. 1.

The antenna coupler 20 is provided in a shield box 21 for forming a space which is electromagnetically shielded from the exterior.

The shield box 21 is formed from a metal (for example, aluminum), and constituted of a lower case 22 whose upper side is open and which is a hollow box type, and an upper case 23 which covers the top face side of the lower case 22 without any gaps and which is freely able to open and close.

Note that, although not illustrated, a radiowave absorber is provided along the inner wall of the shield box 21.

Further, although not illustrated, an opening/closing mechanism (a hinge or the like) for opening and closing the upper case 23 with respect to the lower case 22, and a locking mechanism maintaining the shield box 21 in a closed state are provided.

A plurality of spacers 24 are installed upright at the bottom portion of the lower case 22 of the shield box 21, and a coupling antenna 25 is supported by these spacers 24.

Figure 3:
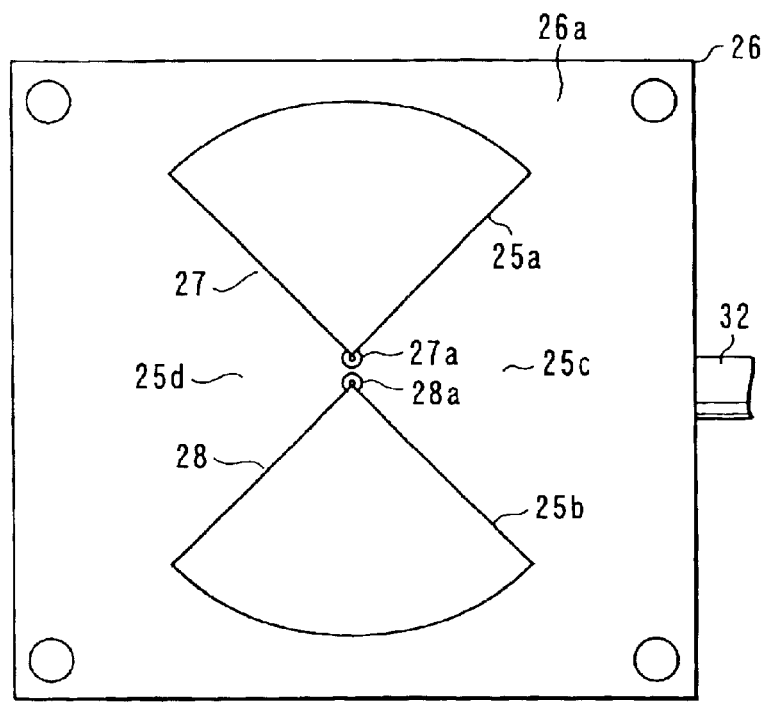
FIG. 3 is a top plan view showing one example of a pattern of a self-complementary antenna constituting a coupling antenna of FIG. 2.

As shown in FIG. 3, the coupling antenna 25 has a dielectric substrate 26 which is substantially rectangular. A pair of antenna elements 27, 28 forming a self-complementary antenna or an antenna in proportion to the self-complementary antenna, such as the antenna element shown in FIG. 8 described later (hereinafter, simply called a self-complementary antenna), are formed at one face 26a side of the dielectric substrate 26.

Namely, as shown in FIG. 3, the coupling antenna 25 is formed as a self-complementary antenna having a shape in which, when first and second conductor patterns 25a, 25b and first and second void patterns 25c, 25d formed on the one face side of the dielectric substrate 26 are respectively rotated a predetermined angle around a predetermined point or are respectively folded back with respect to a predetermined line, the portions of the first and second conductor patterns 25a, 25b and the portions of the first and second void patterns 25c, 25d can be replaced by one another. The coupling antenna 25 is formed as the self-complementary antenna having first and second antenna elements 27, 28 which have a planar structure and in which first and second feeding points 27a, 28a are formed so as to face the respective base end portions of the first and second conductor patterns 25a, 25b. The coupling antenna 25 has a predetermined impedance characteristic which is substantially constant from a lowest usable frequency to a highest usable frequency determined in accordance with the sizes of the first and second antenna elements 27, 28, as described later.

Here, as shown in FIG. 3, one antenna element 27 is constituted of a fan-shaped conductor (metal plate) whose opening angle is 90 degrees, and electricity is fed thereto from the first feeding point 27a.

Further, in the same way as the one antenna element 27, the other antenna element 28 is also constituted of a fan-shaped conductor (metal plate) whose opening angle is 90 degrees, and electricity is fed thereto from the second feeding point 28a.

In this case, the one antenna element 27 and the other antenna element 28 are formed so as to become point symmetry on the dielectric substrate 26.

Note that, the self-complementary antenna is an antenna having a shape in which, in a metal-plate-shaped planar antenna structure in which the antenna elements which are formed from conductive bodies, when the antenna elements are rotated a predetermined angle around a predetermined point or are folded back with respect to a predetermined line, the portions of the metals and the portions of the voids (nonmetal, dielectric substrate) can be replaced by one another.

Moreover, in the self-complementary antenna, when an infinite-sized antenna element is used, the impedance of the antenna is constant (60 $\pi\Omega$) regardless of the operating frequency. However, when the antenna element is a finite size, the usable frequency range is determined in accordance with the size of the antenna element.

In addition, with respect to the usable frequency range of the self-complementary antenna, in practice, the operating frequency range thereof is determined in accordance with limitations on the feeding via an impedance transformer, as described later.

In any case, the operating frequency range of such a self-complementary antenna can be structured so as to cover a wide frequency range sufficiently including 800 MHz to 2.5 GHz order.

If the antenna elements 27, 28 are rotated 90 degrees around the centers of the fan shapes, the metal portions (25a, 25b) and the void portions (25c, 25d) can be replaced by one another, within the radius of the fan shapes. Therefore, the coupling antenna 25 shown in FIG. 3 can be regarded as a self-complementary antenna.

Accordingly, the coupling antenna 25 has a constant impedance close to 60 $\pi\Omega$ in the wide frequency range determined by the radius of the fan shapes.

In this way, it is shown that an antenna having a constant impedance within a wide frequency range, as a result, can be operated within a wide frequency range because the fed electric power is not reflected at a specific frequency range and is efficiently radiated to a testing object.

The self-complementary antenna formed from the antenna elements 27, 28 is a linearly polarized type. The impedance looked over the feeding points 27a, 28a of the antenna elements 27, 28 is substantially constant at a value which is close to 60 $\pi\Omega$ (for example, 200 $\Omega$) within a frequency range of 800 MHz to 2.5 GHz order.

Figure 4:
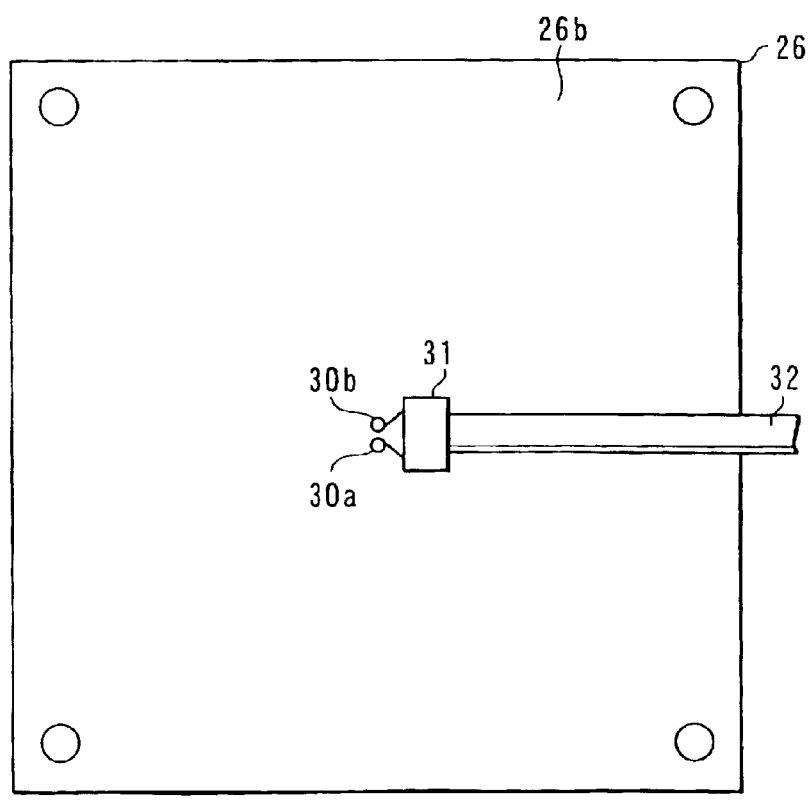
FIG. 4 is a rear elevation showing a rear face side of a coupling antenna of FIG. 3.

The feeding points 27a, 28a of the antenna elements 27, 28 are connected to one end side of an impedance transformer 31 mounted to another face side 26b of the dielectric substrate 26 as shown in FIG. 4, via through-connection portions 30a, 30b formed so as to electrically connect through from the one face side of the substrate 26 to the opposite face side by through-hole plating processing.

Figure 5:
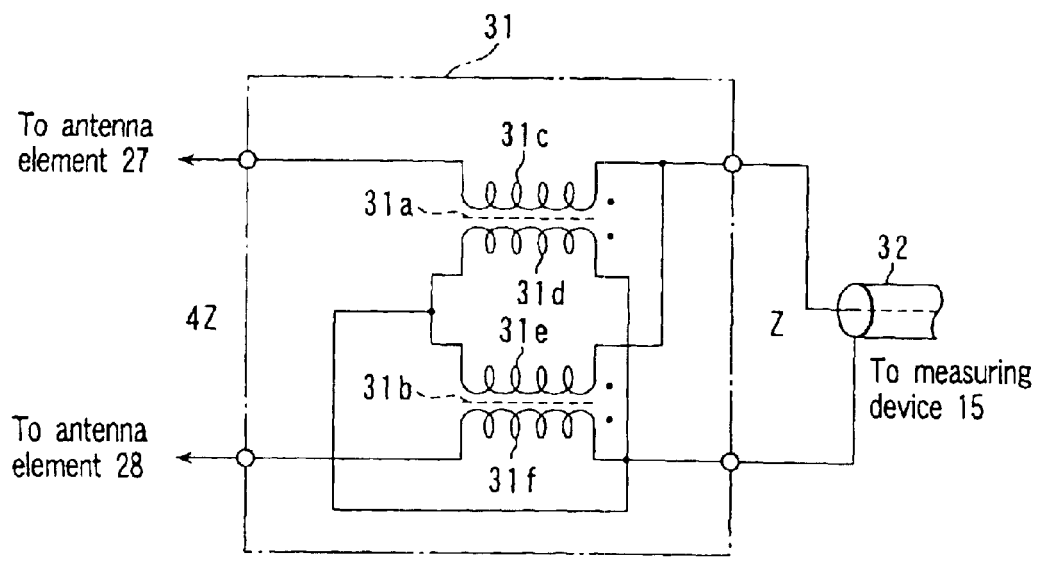
FIG. 5 is a structural diagram showing one example of an impedance transformer of FIG. 4.

Here, the impedance transformer 31, for example, as shown in FIG. 5, is constituted of cores 31a, 31b and coils 31c to 31f, and converts the impedance at 4-to-1 and also performs the operation of a balun (balanced to unbalanced transformer).

The impedance transformer 31 converts the impedance, looked over the antenna elements 27, 28 from the other end side (the unbalanced side), into about 50 $\Omega$.

The impedance transformer 31 configured in this way can stably carry out conversion of the impedance and conversion of balance and unbalance over a wide usable frequency range of 800 MHz to 2.5 GHz order by appropriate selection of the materials of the cores 31a, 31b and the number of windings of the coils 31c to 31f.

Further, one end side of a coaxial cable 32 whose characteristic impedance is 50 $\Omega$ is connected to the other end side of the impedance transformer 31.

The other end side of the coaxial cable 32 is connected to a coaxial connector 33 attached so as to be connectable to a connector from the back face side of the lower case 22.

A placement member 35, which places a portable radio terminal 1 on a face separated by a predetermined distance from the coupling antenna 25 within the shield box 21, is disposed on the coupling antenna 25.

The placement member 35 is formed from an electromagnetically transparent synthetic resin and the edge portions thereof are fixed to the inner wall portions of the lower case 22. The placement member 35 faces the dielectric substrate 26 of the coupling antenna 25 in a parallel state with a predetermined space therebetween.

When testing of the portable radio terminal 1 is carried out by using the antenna coupler 20 configured in this way, first, the upper case 23 of the shield box 21 is opened, and the portable radio terminal 1, which is the testing object, is set at a predetermined position on the placement member 35 in the shield box 21, and thereafter, the shield box 21 is closed.

Further, as shown in FIG. 1, by connecting the coaxial connector 33 and a measuring device 15 by a coaxial cable 16 serving as a connecting means, the measuring device 15 and the antenna coupler 20 are connected, and transmission for sending and receiving test signals and measuring signals is possible.

In accordance therewith, in the shield box 21, testing of the portable radio terminal 1, which is the testing object spatially coupled to the coupling antenna 25, can be carried out by the measuring device 15.

Note that, as shown in this FIG. 1, the portable radio terminal testing apparatus configured by connecting the antenna coupler 20 and the measuring device 15 by the coaxial cable 16 demonstrates the first embodiment of the portable radio terminal testing apparatus of the present invention.

Namely, the portable radio terminal testing apparatus according to the first embodiment of the present invention comprises the shield box 21, the antenna coupler 20 accommodated in the shield box 21, the measuring device 15 provided at the exterior of the shield box 21, and the connection means 32 passing through the shield box 21 so as to connect the antenna coupler 20 and the measuring device 15.

In this case, the measuring device 15 is configured such that predetermined tests including calling, incoming, and sensitivity for the portable radio terminal 1, which is the testing object, can be carried out outside the shield box 21, via electromagnetic coupling of the antenna 1a and antenna 25 within the shield box 21, within an arbitrary operating frequency range from a lowest usable frequency to a highest usable frequency which is determined, as the operating frequency range of the coupling antenna 25, by the sizes of the first and second antenna elements 27, 28 and the limitations on the feeding via the impedance transformer 31.

As described above, the coupling antenna 25 for use in the portable radio terminal testing apparatus according to the embodiment is substantially configured as a unit by using a self-complementary antenna having a wide frequency bandwidth characteristic, and the operating frequency range thereof has a wide frequency bandwidth characteristic including 800 MHz to 2.5 GHz order.

Accordingly, in the portable radio terminal testing apparatus according to the embodiment, a high coupling attenuation can be obtained for not only the portable radio terminal 1, such as a mobile cellular phone or the like having a 800 MHz bandwidth order, a 1.5 GHz bandwidth order, but also for a third-generation portable radio terminal having a 2.2 GHz bandwidth order. Therefore, testing for various types of portable radio terminals whose frequencies are different can be stably carried out by a single portable radio terminal testing apparatus.

Further, in the portable radio terminal testing apparatus according to the embodiment, because the coupling antenna 25 itself has a unit structure, the design is easy, and it can be made to match the impedance of the coaxial cable 32 by the impedance transformer 31 capable of wide bandwidth impedance conversion with a simple structure, and the entire device can be easily and inexpensively manufactured.

Furthermore, in the portable radio terminal testing apparatus according to the embodiment, the portable radio terminal 1, which is the testing object, can be positioned on a surface which is separated by a given distance from the coupling antenna 25, merely by placing the portable radio terminal 1 on the placement member 35. Even if strict positioning is not carried out, testing of the receiving sensitivity characteristic or the like of the portable radio terminal 1 can be carried out with good reproducibility.

Moreover, the portable radio terminal testing apparatus according to the embodiment only uniformly regulates only the distance of the portable radio terminal 1 with respect to the coupling antenna 25 by the placement member 35 on which the portable radio terminal 1 is placed.

In other words, the portable radio terminal testing apparatus according to the embodiment does not regulate anything about the posture of the portable radio terminal 1 which is the testing object. Therefore, a desired coupling state can be obtained by the simple operation of merely adjusting as needed to the postures on the surface of various types of portable radio terminals 1 whose shapes or positions of the antennas are different. Thus, testing of the receiving sensitivity characteristic and the like of the portable radio terminal 1 can be carried out with good reproducibility.

Figure 6A:
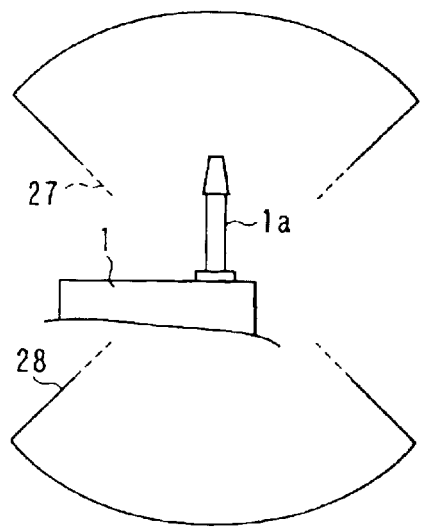
FIGS. 6A and 6B are diagrams shown for explanation of the relationship between a direction and coupling attenuation of a portable radio terminal with respect to the coupling antenna when testing is carried out by the portable radio terminal testing apparatus according to the first embodiment of the present invention.

Note that, in the linearly polarized type coupling antenna 25 used as described above, when the portable radio terminal 1 is set on the placement member 35, as shown in FIG. 6A, the longitudinal direction of the antenna 1a of the portable radio terminal 1 is set so as to coincide with the direction in which the antenna elements 27, 28 of the coupling antenna 25 are aligned, and there is the need to strengthen the coupling by making the respective polarizations of the antennas 1a, 25 equal.

However, in the antenna elements 27, 28 of the coupling antenna 25 for use in the portable radio terminal testing apparatus of the embodiment, electric current flows in a radial direction.

Figure 6B:
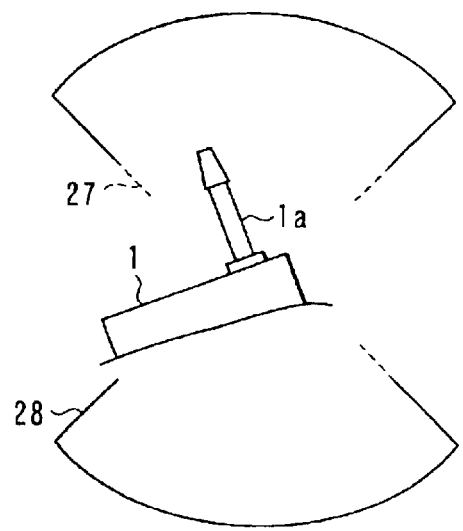

Accordingly, as shown in FIG. 6B, even if the portable radio terminal 1 is oblique to the direction in which the antenna elements 27, 28 of the coupling antenna 25 are aligned, the portable radio terminal 1 coincides with the radial direction thereof, thus the coupling attenuation is not largely changed.

Accordingly, in the portable radio terminal testing apparatus of the embodiment, because there is no need to carry out strict positioning of the portable radio terminal 1, which is the testing object, to the placement member 35, setting of various types of portable radio terminals 1, whose sizes or shapes are different, can be easily accommodated.

Figure 7:
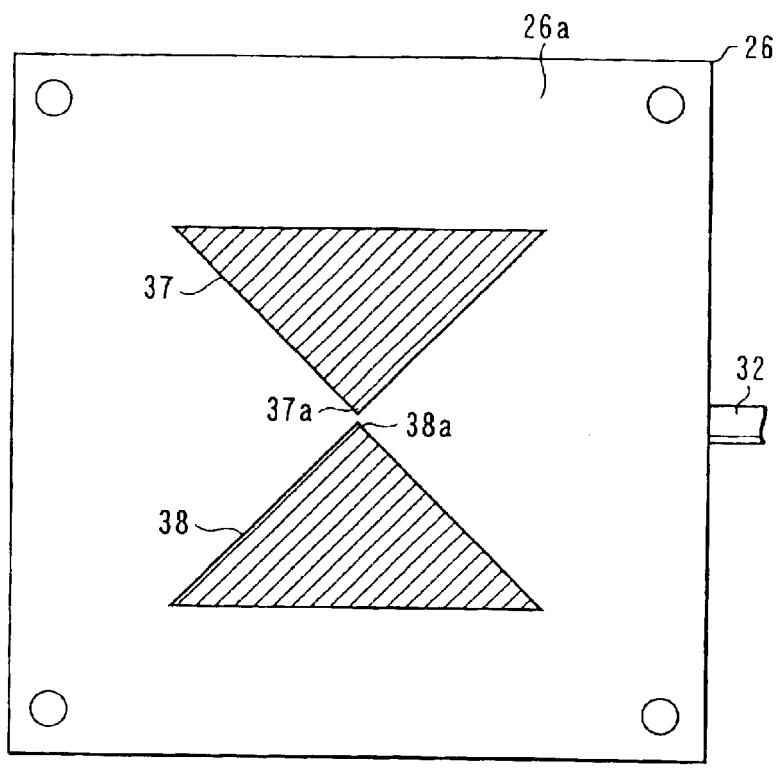
FIG. 7 is a top plan view showing one example of a linearly polarized antenna pattern as a self-complementary antenna constituting the coupling antenna of FIG. 1.

Further, as shown in FIG. 7, a self-complementary antenna formed from two antenna elements 37, 38 which are right-angle isosceles triangle forms may be as the coupling antenna 25 for used in the portable radio terminal testing apparatus of the embodiment.

Figure 8:
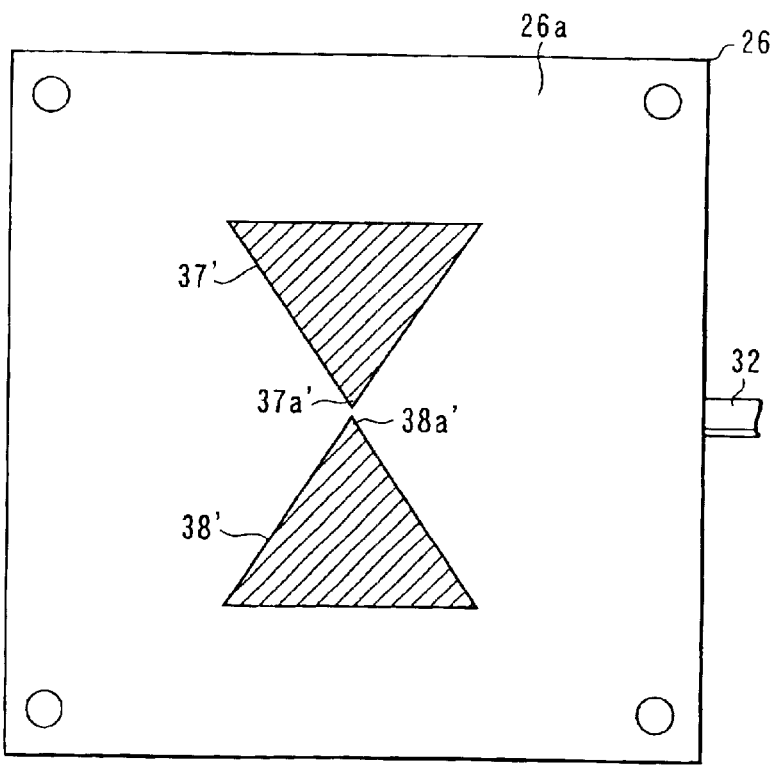
FIG. 8 is a top plan view showing another example of the linearly polarized antenna pattern as a self-complementary antenna constituting the coupling antenna of FIG. 1.

Furthermore, as shown in FIG. 8, an antenna according to a self-complementary antenna formed from two antenna elements 37', 38', whose angles are made less than 90 degrees with respect to the two antenna elements 37, 38 of FIG. 7, may be as the coupling antenna 25 for used in the portable radio terminal testing apparatus of the embodiment.

Note that the feeding points 37a, 37a', 38a, 38a' of the antenna elements 37, 37', 38, 38' are connected to the impedance transformer 31 mounted at the opposite face side of the dielectric substrate 26 via the through-connection portions 30a, 30b in the same way as in FIG. 3 described above.

Although the coupling antenna 25 for use in the portable radio terminal testing apparatus of the above-described embodiment is a linearly polarized type, a circularly polarized type self-complementary antenna may be used.

Figure 9:
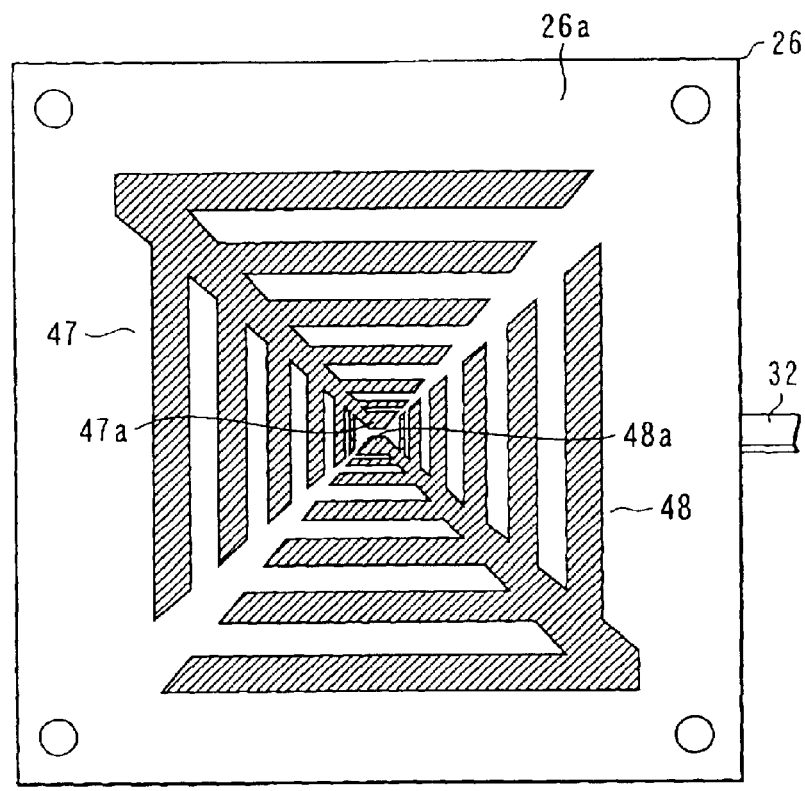
FIG. 9 is a top plan view showing a log-periodic antenna as one example of a circularly polarized antenna pattern as a self-complementary antenna constituting the coupling antenna of FIG. 1.
Figure 10:
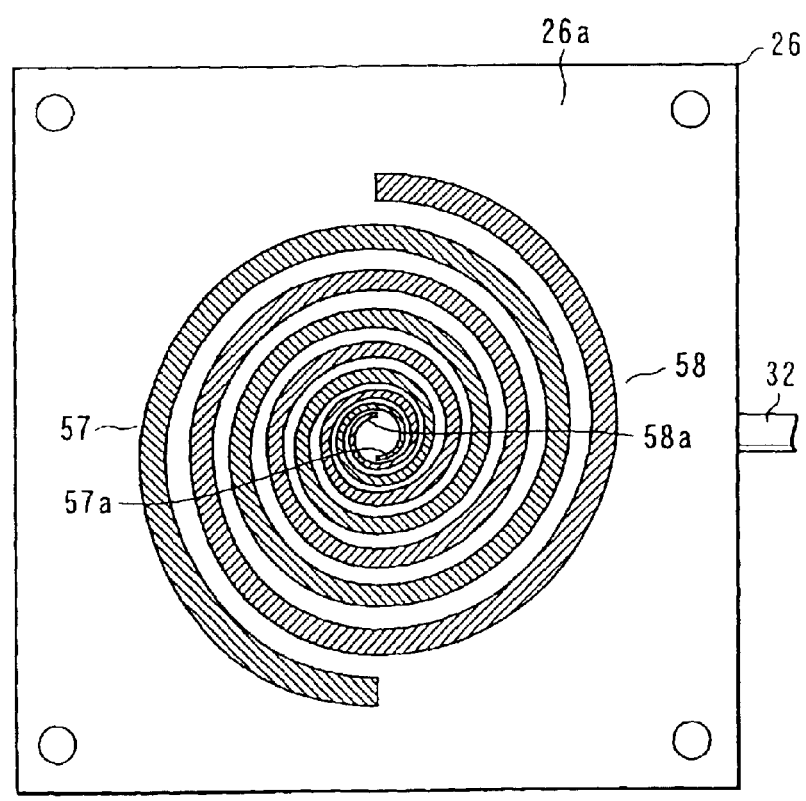
FIG. 10 is a top plan view showing a log-periodic spiral antenna as another example of a circularly polarized antenna pattern as a self-complementary antenna constituting the coupling antenna of FIG. 1.

For example, a self-complementary antenna formed from two log-periodic antennas 47, 48 as shown in FIG. 9 or a self-complementary antenna formed from two log spiral type antennas 57, 58 as shown in FIG. 10 can be the coupling antenna 25 for use in the portable radio terminal testing apparatus of the embodiment.

Meanwhile, the feeding points 47a, 48a, 57a, 58a of the antenna elements 47, 48, 57, 58 shown in FIGS. 9 and 10 are connected to the impedance transformer 31 mounted at the opposite face side of the dielectric substrate 26 via the through-connection portions 30a, 30b in the same way as in FIG. 3 described above.

Note that, the radius and also the width of the spiral, of the two log-periodic spiral type antennas 57, 58 shown in FIG. 10, change in accordance with the angle.

Figure 11:
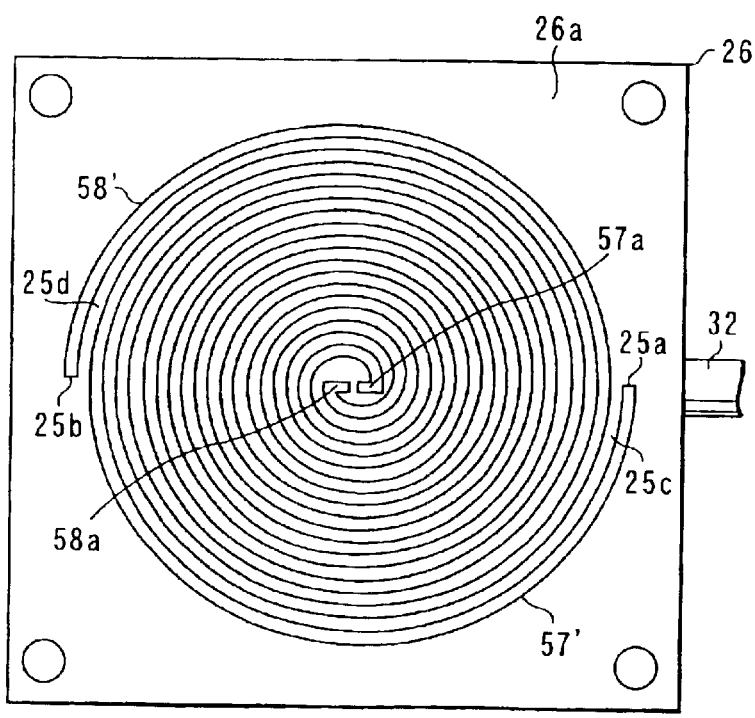
FIG. 11 is a top plan view showing a spiral antenna as another example of a circularly polarized antenna pattern as a self-complementary antenna constituting the coupling antenna of FIG. 1.

On the other hand, as shown in FIG. 11, two spiral type antenna elements 57', 58', which are formed from conductor patterns (metal bands) 25a, 25b and void patterns (nonmetal bands, dielectric substrate) 25c, 25d which have a constant width throughout the entire spiral, also constitute the self-complementary antenna as described above.

Accordingly, by using such a self-complementary antenna formed from two such spiral type antenna elements 57', 58' having a constant width throughout the entire spiral as the coupling antenna for the portable radio terminal testing apparatus according to the embodiment, the coupling antenna 25 has a constant impedance over a wide band as described above, and has the advantage that design and manufacture are easier than the log-periodic spiral type antenna shown in FIG. 10.

In this case, the feeding points 57a, 58a of the antenna elements 57', 58' shown in FIG. 11 are connected to the impedance transformer 31 mounted at the opposite face side of the dielectric substrate 26 via the through-connection portions 30a, 30b in the same way as in FIG. 3 described above.

In this way, when a circularly polarized type antenna is used as the coupling antenna 25 for use in the portable radio terminal testing apparatus, the coupling attenuation is substantially constant regardless of the direction of the antenna 1a of the portable radio terminal 1, which is the testing object, and the portable radio terminal 1 can be placed in an arbitrary direction at an arbitrary position on the placement member 35.

Namely, the portable radio terminal 1 can be placed at an arbitrary posture on the placement member 35, and thereby the work is further simplified.

Further, among the unnecessary radiowaves which cannot be absorbed by the radiowave absorber and are reflected, the odd-number-order reflected waves whose spiral direction is different are not received at the coupling antenna 25. Therefore, there is the advantage that the constant impedance characteristic of the coupling antenna 25 is not adversely affected.

However, for a circularly polarized type antenna, only the outer peripheral portion thereof is excited at a low frequency, and sufficient circular polarization does not arise at positions close to the central portion. Therefore, there is the need to make the distance between the coupling antenna 25 and the portable radio terminal 1 large.

(Second Embodiment)

Figure 12:
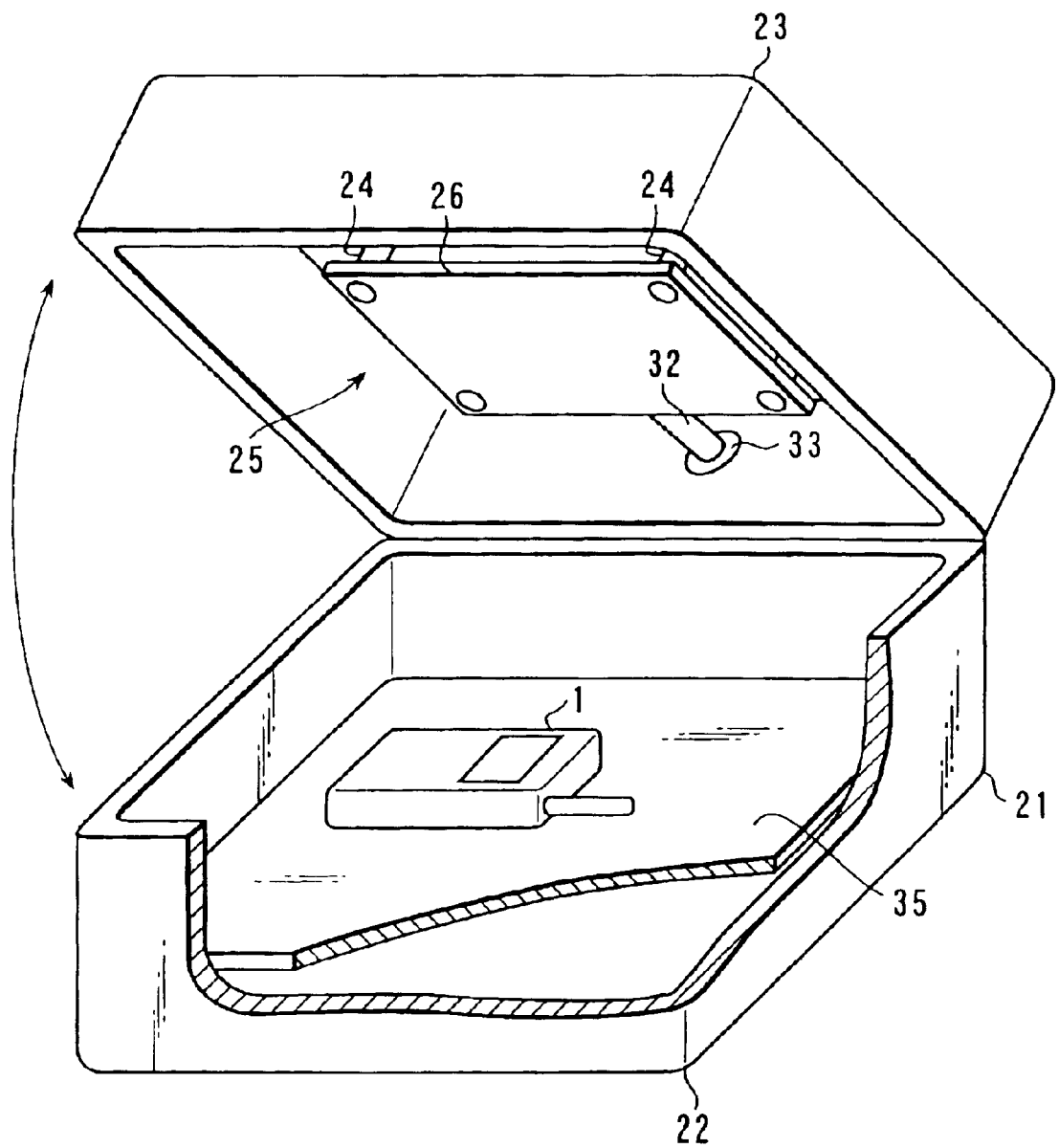
FIG. 12 is a perspective view showing a configuration of main portions in which a measuring device and connecting means are removed and the shield box is partially cutaway, when the stacked arrangement of a coupling antenna and a portable radio terminal is reversed as compared with the case of FIG. 1, as a portable radio terminal testing apparatus according to a second embodiment of the present invention.

FIG. 12 is a perspective view showing a configuration of main portions in which the measuring device 15 and the connecting means 31 are removed and the shield box 21 is partially cutaway when the above-below arrangement of the coupling antenna 25 and the portable radio terminal 1 is reversed, as compared with FIG. 1, as a portable radio terminal testing apparatus according to a second embodiment of the present invention.

In the portable radio terminal testing apparatus according to the above-described first embodiment, the coupling antenna 25 is disposed at the bottom side of the lower case 22 of the shield box 21, and the placement member 35 is disposed thereabove.

On the contrary, as shown in FIG. 12, in the portable radio terminal testing apparatus according to the second embodiment, the coupling antenna 25 is attached along the inner wall of the upper case 23 of the shield box 21, and the portable radio terminal 1 is placed on the placement member 35 attached to the bottom side of the lower case 22.

Note that, in this case, the bottom plate of the lower case 22 may be used in place of the placement member 35, and the portable radio terminal 1 may be directly placed on the bottom plate of the lower case 22.

(Third Embodiment)

Figure 13:
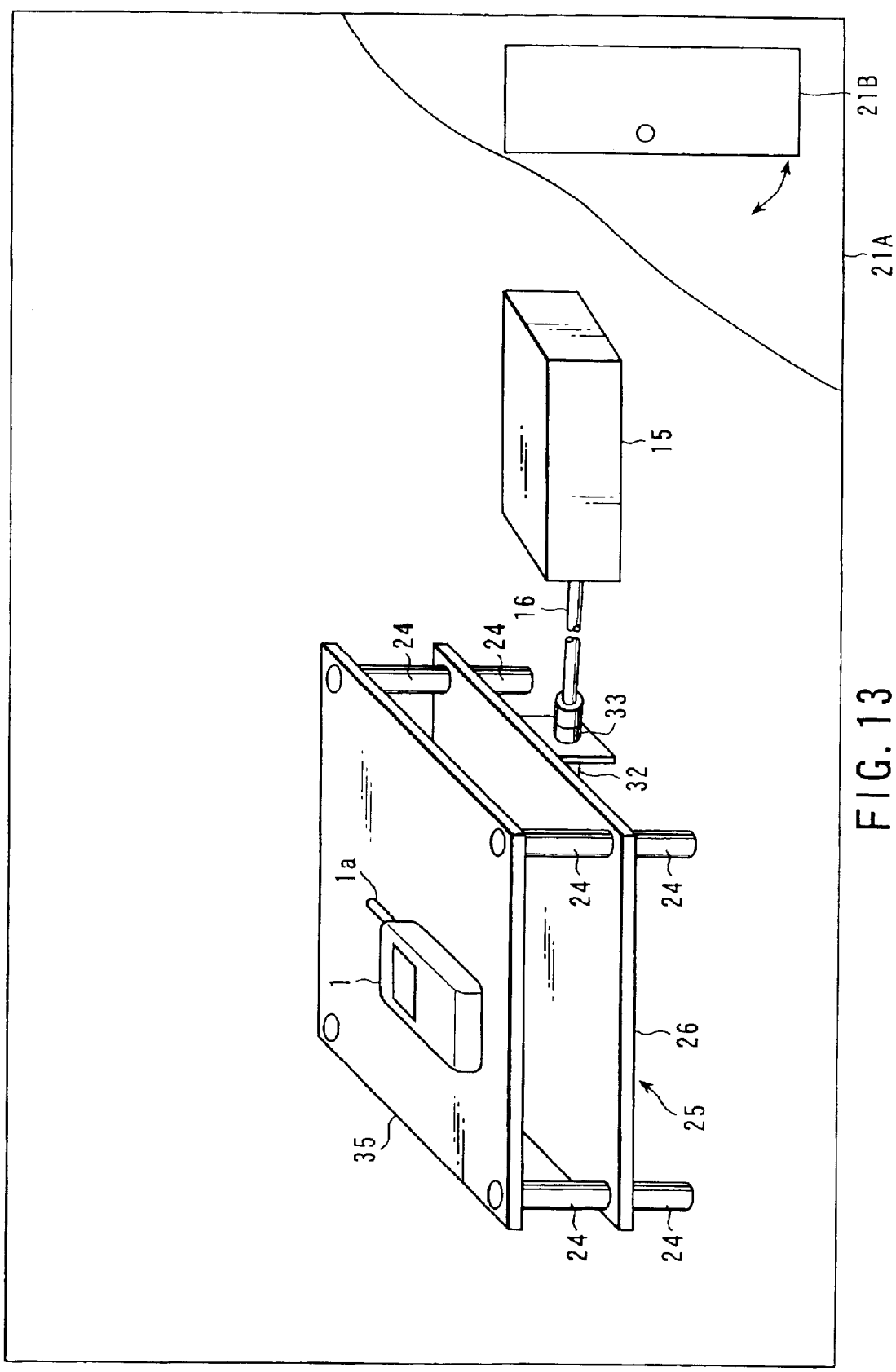
FIG. 13 is a perspective view showing a configuration of main portions when a shield room whose shielded space is large is used as a portable radio terminal testing apparatus according to a third embodiment of the present invention.

FIG. 13 is a perspective view showing a configuration of main portions when a shield room 21A whose shielded space is large is used as a portable radio terminal testing apparatus according to a third embodiment of the present invention.

That is, as shown in FIG. 13, the portable radio terminal testing apparatus according to the third embodiment is formed from the shield room 21A, and the antenna coupler 20, the connecting means 32, and the measuring device 15 which are respectively accommodated within the shield room 21A.

In the portable radio terminal testing apparatus according to the above-described first and second embodiments, the space electromagnetically shielded from the exterior is formed from the shield box 21 whose size is suited for accommodating the portable radio terminal 1 and the antenna coupler 20.

On the other hand, in the portable radio terminal testing apparatus according to the third embodiment, the shielded space is the shield room 21A, which is sufficiently larger than the shield box 21.

The space in the shield room 21A is electromagnetically shielded from the exterior, and has an opening and closing portion 21B for allowing the portable radio terminal 1, which is the testing object, to be placed in removed from the interior, and the placement member 35 for placement of the portable radio terminal 1 in the interior.

When there is a shield room 21A with such a large shielded space, as shown in FIG. 13, the coupling antenna 25 and the placement member 35, which constitute the antenna coupler 20, are made integral so as to face each other in parallel at a uniform interval by the spacer 24, and the portable radio terminal 1 is disposed on the surface, separated by a given distance from the coupling antenna 25.

Note that, when there is a shield room 21A with such a large shielded space and the distance between the coupling antenna 25 and the portable radio terminal 1 can be made to be large, the above-described circularly polarized type self-complementary antenna is used as the coupling antenna 25.

In this case, the measuring device 15 is configured such that predetermined tests including calling, incoming, and sensitivity for the portable radio terminal 1 can be carried out in the shield room 21A, via the electromagnetic coupling between the antenna 1a of the portable radio terminal 1 and the antenna 25 in the shield room 21A, within an arbitrary operating frequency range from a lowest usable frequency to a highest usable frequency which is determined, as the operating frequency range of the coupling antenna 25, by the sizes of the first and second antenna elements 27, 28 and limitations on the feeding via the impedance transformer 31.

(Fourth Embodiment)

Figure 14:
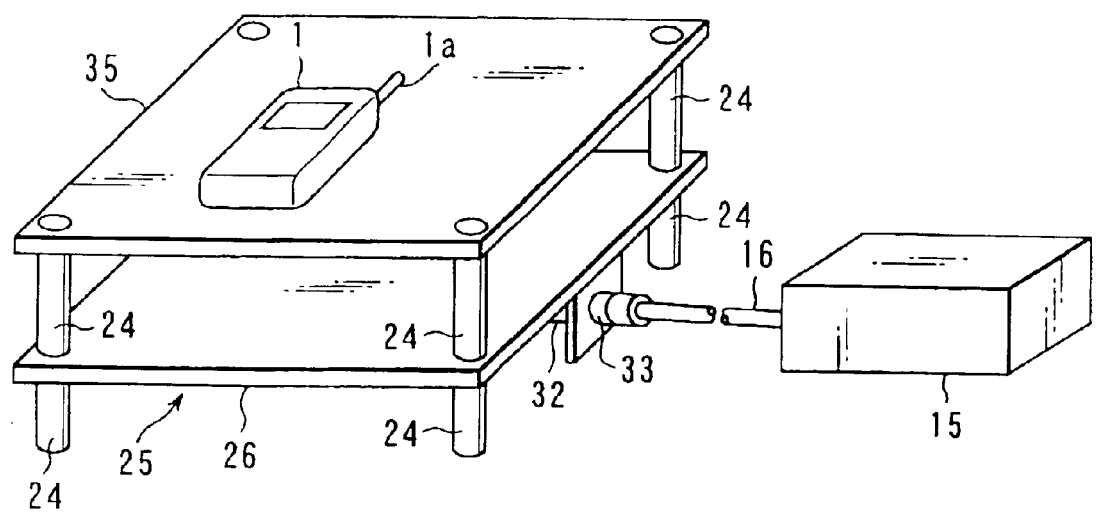
FIG. 14 is a perspective view showing a configuration of main portions when used in environments in which there are hardly any effects of external radio waves, as a portable radio terminal testing apparatus according to a fourth embodiment of the present invention.
Figure 15:
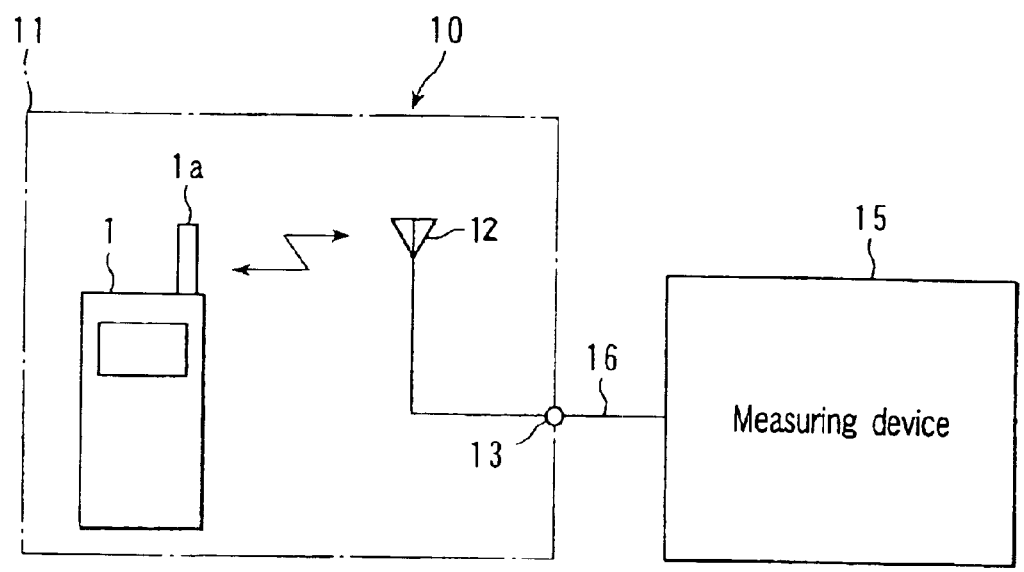
FIG. 15 is a diagram showing a schematic structure of a conventional antenna coupler and a system configuration for testing.

FIG. 14 is a perspective view showing a configuration of main portions when a portable radio terminal testing apparatus according to a fourth embodiment of the present invention is used in environments in which external radio waves and internal reflection have negligible effect.

In such environments, both shield rooms 21A and shield boxes 21 are unnecessary, as shielding means.

Accordingly, if testing of the portable radio terminal 1 is carried out by the portable radio terminal testing apparatus according to the fourth embodiment, as shown in FIG. 14, the coupling antenna 25, which is formed from the antenna coupler 20, the connecting means 32, and the measuring device 15 and which is simply as described above, and the placement member 35 are made integral so as to face each other in parallel at a uniform interval by the spacer 24, and the portable radio terminal 1 is disposed on the surface which is separated by a given distance from the coupling antenna 25.

In this case, the measuring device 15 is configured such that predetermined tests including calling, incoming, and sensitivity for the portable radio terminal 1, which is the testing object, can be carried out via the antenna 1a of the portable radio terminal 1 which is the testing object electromagnetically coupled to the coupling antenna 25, within an arbitrary operating frequency range from a lowest usable frequency to a highest usable frequency which is determined, as the operating frequency range of the coupling antenna 25, by the sizes of the first and second antenna elements 27, 28 and limitations on the feeding via the impedance transformer 31.

(Other Modification Examples)

The configuration of the shield box 21 described above is not necessarily an upper face opening/closing type, and could be a front face (or back face) opening/closing type or a side face opening/closing type, or may be a drawer type.

Further, the coupling antenna 25 may be positioned at the front, back, or side of the shield box 21.

Further, the antenna coupler 20 described above is configured separately from the measuring device 15, and is used by being connected to the measuring device 15 by the coaxial cable 16. However, the antenna coupler 20 may be provided at the interior of the measuring device 15.

In this case, the shield box 21 which is able to open and close is formed within the measuring device 15, and the antenna coupler 20 described above may be mounted at the interior thereof.

Note that, in addition to the above description, various modifications and applications are possible within a range which does not deviate from the gist of the present invention.

As described above, the portable radio terminal testing apparatus according to the first aspect of the present invention comprises an antenna coupler, connecting means, and a measuring device. The antenna coupler comprises: a placement member which places a portable radio terminal thereon, which is a testing object, in an unrestricted state such that the portable radio terminal can be set in an arbitrary posture; and a coupling antenna which is disposed so as to be electromagnetically coupled to an antenna of the portable radio terminal, which is the testing object, placed in an arbitrary posture on the placement member. The coupling antenna comprises: first and second conductor patterns formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another, and first and second antenna elements having planar antenna structures in which first and second feeding points are formed so as to face respective base end portions of the first and second conductor patterns. Thus the coupling antenna is formed as a self-complementary antenna having a predetermined impedance which is substantially constant from a lowest usable frequency to a highest usable frequency determined in accordance with sizes of the first and second antenna elements. The antenna coupler further comprises: first and second through-connection portions which connect through the first and second feeding point portions of the coupling antenna formed at one face side of the dielectric substrate to opposing portion of another face side portion of the dielectric substrate; and an impedance transformer mounted at the other face side of the dielectric substrate in a state in which one end side thereof is connected to the first and second through-connection portions. The connecting means has a predetermined impedance and is configured to be able to connect another end side of the impedance transformer of the antenna coupler and the measuring device. The impedance transformer is configured to be able to carry out impedance conversion for matching the predetermined impedance of the coupling antenna and the predetermined impedance of the connecting means under predetermined conditions. The measuring device is configured such that predetermined tests including calling, incoming, and sensitivity for the portable radio terminal which is the testing object can be carried out via an antenna of the portable radio terminal which is the testing object electromagnetically coupled to the coupling antenna, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

This portable radio terminal testing apparatus is particularly suited to testing of portable radio terminals carried out in environments in which there is no need to prepare a shield room or a shield box as a shielded space, such as where the effects of external radio waves and internal reflection are negligible, where the portable radio terminal testing apparatus can couple with the portable radio terminal over a wide frequency bandwidth by a single coupling antenna, and can stably carry out testing of portable radio terminals whose frequencies vary, using one portable radio terminal testing apparatus.

The portable radio terminal testing apparatus can also be inexpensively configured because manufacture and design of the coupling antenna itself is simple.

Further, the portable radio terminal testing apparatus can match the coupling antenna match to the coaxial cable over a wide frequency range.

Furthermore, in the portable radio terminal testing apparatus, the portable radio terminal, which is the testing object, can be positioned on a surface separated by a given distance from the coupling antenna, merely by utilizing a placement means. Testing of the receiving sensitivity characteristic or the like of the portable radio terminal can be carried out with good reproducibility even if precise positioning is not carried out.

In addition, in the portable radio terminal testing apparatus, because the placement means does not regulate the posture of the portable radio terminal with respect to the coupling antenna, for various types of portable radio terminals whose shapes or antenna positions are different, a desired coupling state can be obtained by the simple operation of merely adjusting the posture thereof on the surface. Testing for various types of portable radio terminals whose shapes or antenna positions are different can thus be easily carried out.

In the portable radio terminal testing apparatus according to the second aspect of the present invention, the operating frequency range of the coupling antenna includes 800 MHz to 2.5 GHz order.

The portable radio terminal testing apparatus is, with one device, compatible with not only mobile cellular phones and portable information terminals of current systems, but also next-generation portable radio terminals.

Further, in the portable radio terminal testing apparatus according to the third aspect of the present invention, the coupling antenna is a linearly polarized type.

In the portable radio terminal testing apparatus, the coupling antenna and the portable radio terminal can be disposed in a state of being close to one another, and a wide frequency bandwidth coupling characteristic can be obtained even when the device is a small device.

Further, in the portable radio terminal testing apparatus according to the fourth aspect of the present invention, the coupling antenna is a circularly polarized type.

In this portable radio terminal testing apparatus, even in a state the coupling antenna and the portable radio terminal are separated, a wide band coupling characteristic can be obtained, and also, effects due to reflected waves can be reduced.

Furthermore, in the portable radio terminal testing apparatus according to the fifth aspect of the present invention, portions of the first and second conductor patterns of the first and second antenna elements and portions of the first and second void patterns are formed in spiral-shaped patterns.

The portable radio terminal testing apparatus according to the sixth aspect of the present invention comprises a shield box, an antenna coupler accommodated in the shield box, a measuring device provided at an exterior of the shield box, and connecting means connecting the antenna coupler and the measuring device. The antenna coupler comprises: a placement member which places, within the shield box, a portable radio terminal thereon, which is a testing object, in an unrestricted state such that the portable radio terminal can be set in an arbitrary posture; a coupling antenna which is disposed, within the shield box, so as to be electromagnetically coupled with an antenna of the portable radio terminal, which is the testing object, placed in an arbitrary posture on the placement member. The coupling antenna comprises: first and second conductor patterns and first and second void patterns formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another, and first and second antenna elements having planar antenna structures in which first and second feeding points are formed so as to face respective base end portions of the first and second conductor patterns. Thus the coupling antenna is formed as a self-complementary antenna having a predetermined impedance which is substantially constant from a lowest usable frequency to a highest usable frequency determined in accordance with sizes of the first and second antenna elements. The antenna coupler comprises: first and second through-connection portions which connect the first and second feeding point portions of the coupling antenna formed at one face side of the dielectric substrate to opposing portions of another face side portion of the dielectric substrate; and an impedance transformer mounted at the other face side of the dielectric substrate in a state in which one end side thereof is connected to the first and second through-connection portions. The connecting means has a predetermined impedance, and is configured to be able to pass through the shield box and connect another end side of the impedance transformer of the antenna coupler and the measuring device. The shield box forms therein a space electromagnetically shielded from an exterior, and is configured so as to have an opening and closing portion for the portable radio terminal which is the testing object to be placed in and removed from the interior. The placement member is configured such that the portable radio terminal can be placed on a surface which is separated by a predetermined distance from the coupling antenna in the interior of the space of the shield box. The impedance transformer is configured to be able to carry out impedance conversion for matching the predetermined impedance of the coupling antenna and the predetermined impedance of the connecting means under predetermined conditions within the shield box. The measuring device is configured such that predetermined tests including calling, incoming, and sensitivity for the portable radio terminal which is the testing object can be carried out outside the shield box via an antenna of the portable radio terminal which is the testing object electromagnetically coupled to the coupling antenna within the shield box, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

Because this portable radio terminal testing apparatus uses a shield box, the portable radio terminal testing apparatus can be coupled to portable radio terminals over a wide frequency band by a single coupling antenna, and used anywhere. The testing of portable radio terminals whose frequency bands are different can thus be stably carried out using one portable radio terminal testing apparatus.

The portable radio terminal testing apparatus can also be inexpensively configured because manufacture and design of the coupling antenna itself is simple.

Further, the portable radio terminal testing apparatus can match the coupling antenna match to the coaxial cable over a wide frequency range.

Furthermore, in the portable radio terminal testing apparatus, the portable radio terminal, which is the testing object, can be positioned on a surface which is separated by a given distance from the coupling antenna by a placement means. Testing of the receiving sensitivity characteristic or the like of the portable radio terminal can be carried out with good reproducibility even if strict positioning is not carried out.

In the portable radio terminal testing apparatus, because the placement means regulates only the distance of the portable radio terminal with respect to the coupling antenna to be constant and does not regulate the posture thereof, for various types of portable radio terminals whose shapes or antenna positions are different, a desired coupling state can be obtained by the simple operation of merely adjusting the postures thereof on the surface. Testing for various types of portable radio terminals whose shapes or antenna positions are different can be easily carried out.

Further, in the portable radio terminal testing apparatus according to the seventh aspect of the present invention, the operating frequency range of the coupling antenna includes 800 MHz to 2.5 GHz order.

The portable radio terminal testing apparatus can, with one device, be used for not only portable telephones and portable information terminals of current systems, but also to next-generation portable radio terminals.

Furthermore, in the portable radio terminal testing apparatus according to the eighth aspect of the present invention, the coupling antenna is a linearly polarized type.

In the portable radio terminal testing apparatus, the coupling antenna and the portable radio terminal can be disposed in a state of being close to one another, and even if the device is small, a wide band coupling characteristic can be obtained.

Moreover, in the portable radio terminal testing apparatus according to the ninth aspect of the present invention, the coupling antenna is a circularly polarized type.

In this portable radio terminal testing apparatus, in a state in which the coupling antenna and the portable radio terminal are separated, effects due to reflected wave can be reduced.

In addition, in the portable radio terminal testing apparatus according to the tenth aspect of the present invention, portions of the first and second conductor patterns of the first and second antenna elements and portions of the first and second void patterns are formed in spiral-shaped patterns.

In this portable radio terminal testing apparatus, in a state in which the coupling antenna and the portable radio terminal are separated, effects due to reflected waves can be reduced.

The portable radio terminal testing apparatus according to the eleventh aspect of the present invention comprises a shield room, and an antenna coupler, connecting means, and a measuring device which are respectively accommodated in the shield room. The antenna coupler comprises: a placement member which places, within the shield room, a portable radio terminal thereon, which is a testing object, in an unrestricted state such that the portable radio terminal can be set in an arbitrary posture; and a coupling antenna which is disposed, within the shield room, so as to be electromagnetically couple with an antenna of the portable radio terminal, which is the testing object, placed in an arbitrary posture on the placement member. The coupling antenna comprises: first and second conductor patterns and first and second void patterns formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another, and first and second antenna elements having planar antenna structures in which first and second feeding points are formed so as to face respective base end portions of the first and second conductor patterns. Thus the coupling antenna is formed as a self-complementary antenna having a predetermined impedance which is substantially constant from a lowest usable frequency to a highest usable frequency determined in accordance with sizes of the first and second antenna elements. The antenna coupler further comprise: first and second through-connection portions which connect through the first and second feeding point portions of the coupling antenna formed at one face side of the dielectric substrate to opposing portions of another face side portion of the dielectric substrate; and an impedance transformer mounted at the other face side of the dielectric substrate in a state in which one end side thereof is connected to the first and second through-connection portions. The connecting means has a predetermined impedance, and is configured to be able to connect another end side of the impedance transformer of the antenna coupler and the measuring device within the shield room. The shield room forms therein a space electromagnetically shielded from an exterior, and is configured so as to have an opening and closing portion for the portable radio terminal which is the testing object to be placed in and removed from the interior. The placement member is configured such that the portable radio terminal can be placed on a surface which is separated by a predetermined distance from the coupling antenna in the interior of the space of the shield room. The impedance transformer is configured to be able to carry out impedance conversion for matching the predetermined impedance of the coupling antenna and the predetermined impedance of the connecting means under predetermined conditions within the shield room, and the measuring device is configured such that a predetermined tests including calling, incoming, and sensitivity for the portable radio terminal which is the testing object can be carried out in the shield room via an antenna of the portable radio terminal which is the testing object electromagnetically coupled to the coupling antenna within the shield room, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

In this portable radio terminal testing apparatus, because a shield room whose shielded space is large is used, the size of the device is not limited, and the device can be coupled to portable radio terminals over a wide frequency band by a single coupling antenna. Testing of portable radio terminals whose each frequency bandwidth are different can be stably carried out by one portable radio terminal testing apparatus.

The portable radio terminal testing apparatus can also be inexpensively configured because manufacturing and designing of the coupling antenna itself is easy.

Further, the portable radio terminal testing apparatus can make the coupling antenna match the coaxial cable over a wide frequency range.

Furthermore, in the portable radio terminal testing apparatus, the portable radio terminal, which is the testing object, can be positioned on a surface which is separated by a given distance from the coupling antenna, by a placement means. Therefore, testing of the receiving sensitivity characteristic or the like of the portable radio terminal can be carried out with good reproducibility even if strict positioning is not carried out.

Moreover, in the portable radio terminal testing apparatus, because the placement means regulates only the distance of the portable radio terminal with respect to the coupling antenna to be constant and does not regulate the posture thereof, for various types of portable radio terminals whose shapes or antenna positions vary, a desired coupling state can be obtained by the simple operation of merely adjusting the posture thereof on the surface. Testing for the various types of portable radio terminals whose shapes or antenna positions vary can be easily carried out.

In the portable radio terminal testing apparatus according to the twelfth aspect of the present invention, the operating frequency range of the coupling antenna includes 800 MHz to 2.5 GHz.

The portable radio terminal testing apparatus can, with one device, be used not only for portable telephones and portable information terminals of current systems, but also for next-generation portable radio terminals.

Further, in the portable radio terminal testing apparatus according to the thirteenth aspect of the present invention, the coupling antenna is a linearly polarized type.

In this portable radio terminal testing apparatus, the coupling antenna and the portable radio terminal can be disposed in a state of being close to one another, and even when the device is a small device, a wide band coupling characteristic can be obtained.

Furthermore, in the portable radio terminal testing apparatus according to the fourteenth aspect of the present invention, the coupling antenna is a circularly polarized type.

In this portable radio terminal testing apparatus, a wide band coupling characteristic can be obtained even in a state the coupling antenna and the portable radio terminal are separated, and effects due to reflected waves can be reduced.

In the portable radio terminal testing apparatus according to the fifteenth aspect of the present invention, portions of the first and second conductor patterns of the first and second antenna elements and portions of the first and second void patterns are formed in spiral-shaped patterns.

In this portable radio terminal testing apparatus, in a state in which the coupling antenna and the portable radio terminal are separated, effect due to reflected waves can be reduced.

Accordingly, as described above in detail, according to the present invention, a portable radio terminal testing apparatus can be provided which can, with a simple structure, be used within a wide frequency bandwidth including the current frequency bandwidth and the frequency bandwidth expected for the future, and whose operation is easy, and can be used with various types of portable radio terminals whose shapes and antenna positions vary, and in which a single self-complementary antenna is used as a coupling antenna.

What is claimed is:

1. A portable radio terminal testing apparatus comprising an antenna coupler, connecting means, and a measuring device, wherein the antenna coupler comprises:
a placement member which places a portable radio terminal wherein, which is a testing object, in an unrestricted state such that the portable radio terminal can be set in an arbitrary posture;
a coupling antenna which is disposed so as to be electromagnetically coupled to an antenna of the portable radio terminal, which is the testing object, placed in an arbitrary posture on the placement member, the coupling antenna comprises:
first and second conductor patterns and first and second void patterns formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another, and
first and second antenna elements having planar antenna structures in which first and second feeding points are formed so as to face respective base end portions of the first and second conductor patterns, so that the coupling antenna is formed as a self-complementary antenna having a predetermined impedance which is substantially constant from a lowest usable frequency to a highest usable frequency determined in accordance with sizes of the first and second antenna elements;

first and second through-connection portions which connect through the first and second feeding point portions of the coupling antenna formed at one face side of the dielectric substrate to opposing portions of another face side portion of the dielectric substrate; and an impedance transformer mounted at the other face side of the dielectric substrate in a state in which one end side thereof is connected to the first and second through-connection portions, wherein the connecting means has a predetermined impedance and is configured to be able to connect the other end side of the impedance transformer of the antenna coupler and the measuring device, the impedance transformer is configured to be able to carry out impedance conversion for matching the predetermined impedance of the coupling antenna and the predetermined impedance of the connecting means under predetermined conditions, and the measuring device is configured such that predetermined tests including calling, incoming, and sensitivity for the portable radio terminal which is the testing object can be carried out via an antenna of the portable radio terminal which is the testing object electromagnetically coupled to the coupling antenna, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

2. A portable radio terminal testing apparatus according to claim 1, wherein the operating frequency range of the coupling antenna includes 800 MHz to 2.5 GHz order.

3. A portable radio terminal testing apparatus according to claim 1, wherein the coupling antenna is a linearly polarized type.

4. A portable radio terminal testing apparatus according to claim 1, wherein the coupling antenna is a circularly polarized type.

5. A portable radio terminal testing apparatus according to claim 1, wherein the portions of the first and second conductor patterns of the first and second antenna elements and the portions of the first and second void patterns are formed in spiral-shaped patterns.

6. A portable radio terminal testing apparatus comprising a shield box, an antenna coupler accommodated in the shield box, a measuring device provided at an exterior of the shield box, and connecting means for connecting the antenna coupler and the measuring device, wherein the antenna coupler comprises:
a placement member which places, within the shield box, a portable radio terminal thereon, which is a testing object, in an unrestricted state such that the portable radio terminal can be set at an arbitrary posture;
a coupling antenna which is disposed, within the shield box, so as to be electromagnetically coupled with an antenna of the portable radio terminal, which is the testing object, placed in an arbitrary posture on the placement member, the coupling antenna comprises:
first and second conductor patterns and first and second void patterns formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another; and
first and second antenna elements having planar antenna structures in which first and second feeding points are formed so as to face respective base end portions of the first and second conductor patterns, so that the coupling antenna is formed as a self-complementary antenna having a predetermined impedance which is substantially constant from a lowest usable frequency to a highest usable frequency determined in accordance with sizes of the first and second antenna elements;

first and second through-connection portions which connect through the first and second feeding point portions of the coupling antenna formed at one face side of the dielectric substrate to opposing portions of another face side portion of the dielectric substrate; and an impedance transformer mounted at the other face side of the dielectric substrate in a state in which one end side thereof is connected to the first and second through-connection portions, wherein the connecting means has a predetermined impedance, and is configured to be able to pass through the shield box and connect another end side of the impedance transformer of the antenna coupler and the measuring device, the shield box forms therein a space electromagnetically shielded from an exterior, and is configured to have an opening and closing portion for the portable radio terminal which is the testing object to be placed in and removed from the interior, the placement member is configured such that the portable radio terminal can be placed on a surface which is separated by a predetermined distance from the coupling antenna in the interior of the space of the shield box, the impedance transformer is configured to be able to carry out impedance conversion for matching the predetermined impedance of the coupling antenna and the predetermined impedance of the connecting means under predetermined conditions within the shield box, and the measuring device is configured such that predetermined tests including calling, incoming, and sensitivity for the portable radio terminal which is the testing object can be carried out outside the shield box via an antenna of the portable radio terminal which is the testing object electromagnetically coupled to the coupling antenna within the shield box, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

7. A portable radio terminal testing apparatus according to claim 6, wherein the operating frequency range of the coupling antenna includes 800 MHz to 2.5 GHz order.

8. A portable radio terminal testing apparatus according to claim 6, wherein the coupling antenna is a linearly polarized type.

9. A portable radio terminal testing apparatus according to claim 6, wherein the coupling antenna is a circularly polarized type.

10. A portable radio terminal testing apparatus according to claim 6, wherein the portions of the first and second conductor patterns of the first and second antenna elements and the portions of the first and second void patterns are formed in spiral-shaped patterns.

11. A portable radio terminal testing apparatus comprising a shield room, and an antenna coupler, connecting means, and a measuring device which are respectively accommodated in the shield room, wherein the antenna coupler comprises:

a placement member which places, within the shield room, a portable radio terminal thereon, which is a testing object, in an unrestricted state such that the portable radio terminal can be set at an arbitrary posture;

a coupling antenna which is disposed, within the shield room, so as to be electromagnetically coupled with an antenna of the portable radio terminal, which is the testing object, placed in an arbitrary posture on the placement member, the coupling antenna comprises:

which is formed on one face side of a dielectric substrate so as to have a shape in which, when they are respectively rotated by a predetermined angle around a predetermined point or are respectively folded back with respect to a predetermined line, portions of the conductor patterns and portions of the void patterns can be replaced by one another, and first and second antenna elements having planar antenna structures in which first and second feeding points are formed so as to face respective base end portions of the first and second conductor patterns, so that the coupling antenna is formed as a self-complementary antenna having a predetermined impedance which is substantially constant from a lowest usable frequency to a highest usable frequency determined in accordance with sizes of the first and second antenna elements;

first and second through-connection portions which connect through the first and second feeding point portions of the coupling antenna formed at one face side of the dielectric substrate to opposing portions of another face side portion of the dielectric substrate; and an impedance transformer mounted at the other face side of the dielectric substrate in a state in which one end side thereof is connected to the first and second through-connection portions, wherein the connecting means has a predetermined impedance, and is configured to be able to connect another end side of the impedance transformer of the antenna coupler and the measuring device within the shield room, the shield room forms therein a space electromagnetically shielded from an exterior, and is configured to have an opening and closing portion for the portable radio terminal which is the testing object to be placed in and removed from the interior, the placement member is configured such that the portable radio terminal can be placed on a surface which is separated by a predetermined distance from the coupling antenna in the interior of the space of the shield room, the impedance transformer is configured to be able to carry out impedance conversion for matching the predetermined impedance of the coupling antenna and the predetermined impedance of the connecting means under predetermined conditions within the shield room, and the measuring device is configured such that predetermined tests including calling, incoming, and sensitivity for the portable radio terminal which is the testing object can be carried out in the shield room via an antenna of the portable radio terminal which is the testing object electromagnetically coupled to the coupling antenna within the shield room, within an arbitrary operating frequency range from a lowest usable frequency to a highest usable frequency which is determined, as an operating frequency range of the coupling antenna, in accordance with the sizes of the first and second antenna elements and limitations on feeding via the impedance transformer.

12. A portable radio terminal testing apparatus according to claim 11, wherein the operating frequency range of the coupling antenna includes 800 MHz to 2.5 GHz order.

13. A portable radio terminal testing apparatus according to claim 11, wherein the coupling antenna is a linearly polarized type.

14. A portable radio terminal testing apparatus according to claim 11, wherein the coupling antenna is a circularly polarized type.

15. A portable radio terminal testing apparatus according to claim 11, wherein the portions of the first and second conductor patterns of the first and second antenna elements and the portions of the first and second void patterns are formed in spiral-shaped patterns.

* * * * *